United States Patent
Furukawa et al.

(10) Patent No.: US 8,106,434 B2
(45) Date of Patent: Jan. 31, 2012

(54) SEMICONDUCTOR DEVICE WITH A SUPERPARAELECTRIC GATE INSULATOR

(75) Inventors: Yukiko Furukawa, Veldhoven (NL);
Cornelius A H A Mutsaers, Veldhoven (NL)

(73) Assignee: NXP B.V., Eindhoven (NL)

( * ) Notice: Subject to any disclaimer, the term of this patent is extended or adjusted under 35 U.S.C. 154(b) by 1122 days.

(21) Appl. No.: 11/722,518

(22) PCT Filed: Dec. 13, 2005

(86) PCT No.: PCT/IB2005/054216
§ 371 (c)(1),
(2), (4) Date: Jun. 21, 2007

(87) PCT Pub. No.: WO2006/067678
PCT Pub. Date: Jun. 29, 2006

(65) Prior Publication Data
US 2010/0001324 A1    Jan. 7, 2010

(30) Foreign Application Priority Data
Dec. 21, 2004 (GB) .................... 0427900.6

(51) Int. Cl.
*H01L 21/02* (2006.01)
*H01L 21/00* (2006.01)
*H01L 21/336* (2006.01)

(52) U.S. Cl. ......... 257/295; 257/E29.244; 257/E21.409; 438/197; 438/3

(58) Field of Classification Search .................. 257/295, 257/775, 410, 40, 759, E29.244, E21.409, 257/213, 310, E29.02; 438/3, 149, 624, 240, 438/142, 197
See application file for complete search history.

(56) References Cited

U.S. PATENT DOCUMENTS

| | | | |
|---|---|---|---|
| 5,739,563 A * | 4/1998 | Kawakubo et al. | 257/295 |
| 6,005,274 A * | 12/1999 | Gardner et al. | 257/411 |
| 6,255,122 B1 | 7/2001 | Duncombe et al. | |
| 6,265,749 B1 | 7/2001 | Gardner et al. | |
| 6,306,742 B1 * | 10/2001 | Doyle et al. | 438/591 |
| 6,468,858 B1 | 10/2002 | Lou | |
| 6,635,528 B2 * | 10/2003 | Gilbert et al. | 438/253 |

(Continued)

FOREIGN PATENT DOCUMENTS
WO   WO9629734 A1   9/1996

OTHER PUBLICATIONS

Bell, "Calculation of dielectric properties from the superparaelectric model of relaxors", 1993, J.Phys. Condens. Matter, vol. 5, pp. 8773-8792.*

(Continued)

*Primary Examiner* — Thomas L Dickey
*Assistant Examiner* — Nikolay Yushin

(57) ABSTRACT

A semiconductor device includes a channel region 18 of semiconductor, a conductive gate electrode 12 adjacent to the channel region 18 and a gate dielectric 10 between the conductive gate electrode 12 and the channel region 18. The gate dielectric 10 is formed of a material that is a ferroelectric in bulk but in a superparaelectric state. The gate dielectric may be for instance of formula $AXO_3$, where A is a group I or II element, and X is titanium, niobium, zirconium and/or hafnium. Such a gate dielectric 10 may be formed for example by low temperature deposition of the gate dielectric 10 or by using dopants of metal oxides to prevent domain growth, or both.

6 Claims, 1 Drawing Sheet

U.S. PATENT DOCUMENTS

Figure 1:
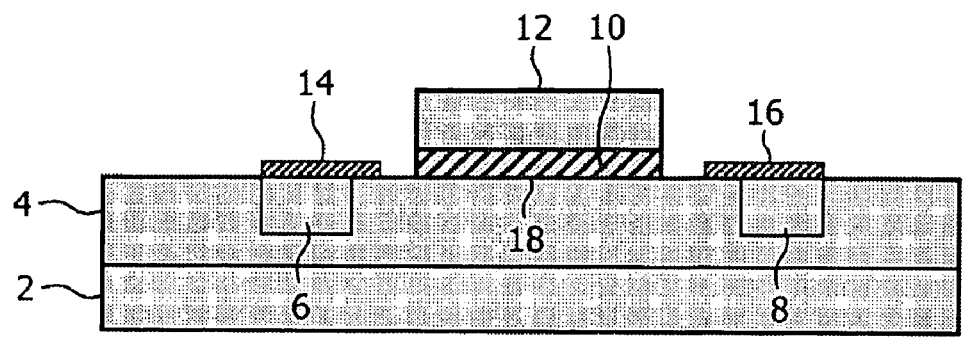

| | | | |
|---|---|---|---|
| 6,642,591 B2 | 11/2003 | Ikeda et al. | |
| 6,709,989 B2 * | 3/2004 | Ramdani et al. | 438/763 |
| 6,727,995 B1 | 4/2004 | Halliyal et al. | |
| 2002/0117725 A1 * | 8/2002 | Oowaki et al. | 257/410 |
| 2002/0167005 A1 * | 11/2002 | Yu et al. | 257/43 |
| 2006/0210993 A1 * | 9/2006 | Chowdhury et al. | 435/6 |

OTHER PUBLICATIONS

Cernea et al., "Preparation and characterization of Ce-doped BaTiO3 thin films . . . ", 2001, Journal of Material Science, vol. 36, pp. 5027-5030.*

Shin et al., Nucleation and growth mechanism of ferroelectric domain-wall motion, 2007, Nature, Letters, vol. 447, pp. 881-884.*

Tsai et al., "The thickness dependence of ferroelectric domains in thin crystalline films", 1994, Appl. Phys. Letters, vol. 65 (15), pp. 1906-1908.*

"The Strain-Induced Ferroelectric Properties of C-Axis Oriented (BA,SR) TI03 Thin Films" Surface and Coatings Technology Elsevier Switzerland, vol. 131, No. 1-3 Sep. 1, 2000, pp. 553-557 Sungjin Jun et al.

* cited by examiner

SEMICONDUCTOR DEVICE WITH A SUPERPARAELECTRIC GATE INSULATOR

The invention relates to a semiconductor device with a gate insulator having a high dielectric constant and a method of manufacturing the semiconductor device.

As is well known, field effect transistors (FETs) use a gate conductor separated from a semiconductor channel region by a thin gate insulator. Voltage applied to the gate controls conduction through the channel region.

Traditionally, silicon dioxide has been used as a gate dielectric since it can be grown on silicon simply by oxidizing the silicon. Other materials such as silicon nitride and multi-layers of silicon oxide and silicon nitride have also been widely used.

It is generally desirable to integrate more and more such FETs on a single substrate, and further to increase speed. However, this can require thinning of the gate dielectric and problems occur when silicon oxide and other traditional gate materials are thinned to the thicknesses required in future circuits.

This has led in turn for a desire for higher dielectric constant gate dielectrics, which can improve performance and reduce size.

A number of materials have been suggested in the past.

Many candidate dielectric materials are binary metal oxides such as $HfO_2$, $ZrO_2$, $Al_2O_3$, $Y_2O_3$, $La_2O_3$, $Pr_2O_3$, $Gd_2O_3$, silicate and mixtures thereof. Such materials have dielectric constants in the range of 10 to 30. Such materials allow the use of a thicker gate dielectric, which reduces tunnel leakage current. However, there remains a need for a gate dielectric with a dielectric constant above 30.

U.S. Pat. No. 6,005,274 teaches a variety of materials such as barium zirconium titantate ($Ba(Zr,Ti)O_3$), strontium titanate ($SrTiO_3$), or tantalum pentoxide ($TaO_5$). These materials are ferroelectric materials with very high dielectric constants.

Unfortunately, ferroelectric material in general does not have electrical properties that are stable with temperature and frequency. The high polarization, and hence high dielectric constant, means that there is a high dipole moment, and the dipoles can switch. Such changes in electrical properties with temperature and frequency are highly undesirable both for the thermal stability and frequency stability of semiconductor devices in use, and also for the ability of the semiconductor devices to withstand thermal processing during the process for manufacturing the device.

According to the invention, there is provided a semiconductor device comprising:

a channel region of semiconductor;

a conductive gate electrode adjacent to the channel region; and a gate dielectric between the conductive gate electrode and the channel region;

wherein the gate dielectric is a superparaelectric gate dielectric formed of a material that is a ferroelectric in bulk.

By using a material in a super-paraelectric regime, even though the same material may be ferroelectric in bulk, a high dielectric constant gate dielectric is achieved without the disadvantages of a ferroelectric dielectric, i.e. without the same sensitivity of the electrical properties to temperature and frequency.

The gate dielectric may be of a material that is perovskite In bulk of formula $AXO_3$, where A is group I or group II element or a rare earth element, and X is titanium, niobium, zirconium and/or hafnium.

The gate dielectric may include a dopant for hindering domain growth, the dopant not forming a solid solution completely in the gate dielectric material.

The dopant may be an oxide of Si, Ca, Al, Nb, La, Zr, Pb, Sr, Mn, W or a rare earth.

The thickness of the gate dielectric may be less than 100 nm.

The material of the gate dielectric may be stoichiometric $BaTiO_3$.

The dielectric constant of the gate dielectric is preferably in the range 30 to 200, further preferably 50 to 100.

The invention also relates to a method of making a semiconductor device, comprising:

forming a channel region;

depositing a gate dielectric; and depositing a gate conductor sandwiching the gate dielectric between the channel region and the gate conductor;

wherein in the step of depositing the gate dielectric the gate dielectric is a superparaelectric gate dielectric formed of a material that is a ferroelectric in bulk.

The material of the gate dielectric may be a perovskite material $AXO_3$, where A is a group I or II element, or a rare earth element and X is titanium, niobium, zirconium and/or hafnium, the gate dielectric being formed as a gate dielectric without sufficient ferroelectric domains to be ferroelectric and having a thickness of the gate dielectric such that the gate dielectric acts as a superparaelectric gate dielectric. Preferably, A is a group I or group II element.

In general, deposition of a ferroelectric material results in a thin film that is itself ferroelectric. The invention therefore requires the use of techniques to avoid the gate dielectric having ferroelectric properties when it is deposited. There is more than one way in which a ferroelectric material may be deposited in such a way that it does not act as a ferroelectric but as a superparaelectric material.

Firstly, a low temperature deposition process may be used. In this case the gate dielectric may be deposited at a substrate temperature no higher than 300° C. using molecular beam epitaxy (MBE), pulsed laser deposition (PLD) or atomic layer deposition (ALD). Preferably, the substrate is held at a nominal room temperature during growth and does not exceed 100° C. during growth.

Secondly, the method may include forming a dopant in the gate dielectric to hinder domain growth.

The dopant may be an oxide not forming a solid solution with the gate dielectric such as an oxide of Nb, La, Zr, Pb, Sr, Mn, W or rare earth.

The gate dielectric may be of $BaTiO_3$.

Using a dopant, other higher temperature deposition processes may be useable, including for example MOCVD and a sol/gel process.

Thirdly, a combination of these techniques may be used, i.e. combining a low temperature deposition using MBE, ALD or PLD with adding a dopant to avoid domain growth.

Figure 2:
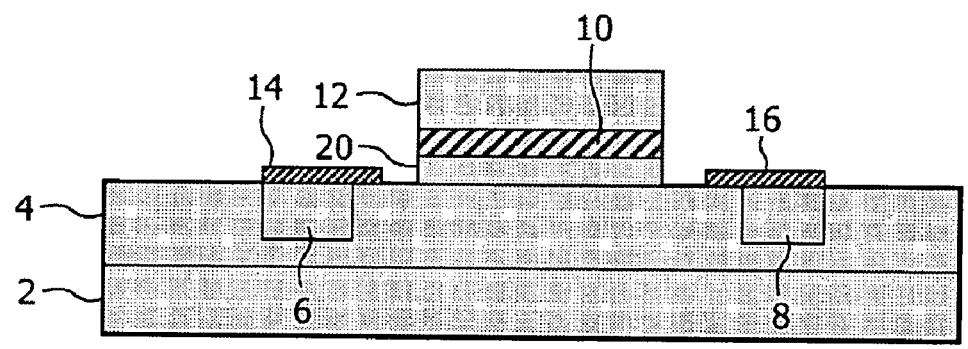
Figure 3:
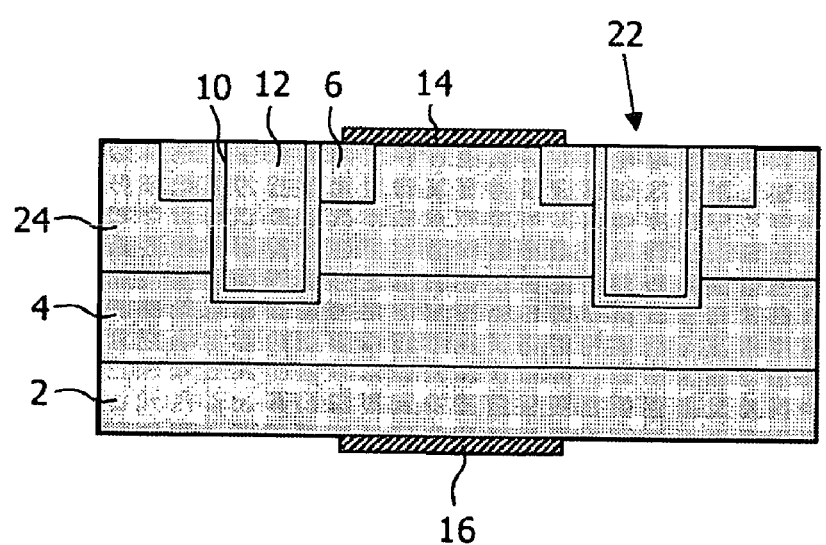

For a better understanding of the invention, embodiments will now be described, purely by way of example, with reference to the accompanying drawings in which FIG. 1 shows a semiconductor device according to a first embodiment of the invention;

FIG. 2 shows a semiconductor device according to a second embodiment of the invention; and FIG. 3 shows a semiconductor device according to a third embodiment of the invention.

Referring to FIG. 1, a semiconductor substrate 2 has an p-type doped epilayer 4 and n+ doped source 6 and drain 8 diffusions formed in the epilayer.

A gate dielectric 10 is formed on the substrate between the source and gate diffusions 6, 8 and a gate electrode 12 is formed on the gate dielectric 10.

Source 14 and drain 16 contacts are formed in contact with the source and drain diffusions 6, 8 respectively.

The region of the substrate under the gate electrode defines a channel 18.

The skilled person will be aware of how to manufacture transistors of this type so further details of these processes are considered unnecessary here.

The invention differs from such transistors by virtue of the choice of gate dielectric 10.

In the embodiment, the gate dielectric is formed of a material of perovskite structure, that is to say of formula $AXO_3$, where A is a group I or II element or a rare earth, and X is titanium, niobium, hafnium and/or zirconium. Such materials are generally ferroelectric.

However, the gate dielectric is formed in such a way that the gate dielectric does not display ferroelectric properties, but instead acts as a superparaelectric material.

In the embodiment, this is achieved by ensuring that the thickness of the gate dielectric is thin enough and also by ensuring that ferroelectric domains do not form.

The first embodiment of the invention achieves this by growing a gate dielectric formed in this embodiment of stochiometric $BaTiO_3$ by molecular beam epitaxy (MBE) with a substrate held at room temperature, and further by growing the gate dielectric to a thickness of less than 100 nm. The size effect of the thin film and the absence of large ferroelectric domains together with the use of stochiometric barium titanate results in the absence of ferroelectric domains.

It is preferred to grow the barium titanate lattice matched to the substrate. This may be done using doping or control of deposition.

Further, after the gate dielectric is formed, subsequent processing does not increase the temperature above 300° C.

In this way, ferroelectric domains cannot grow and the gate dielectric displays superparaelectric properties with a dielectric constant in the range 30 to 200.

This compares with a dielectric constant of about 10 000 for bulk barium titanate, which value depends on the exact microstructure and hence on processing.

By forming a superparaelectric thin film instead of a bulk ferroelectric material the film is stable under subsequent thermal processing or heating during device operation. This ensures much better reproducibility than using the ferroelectric material, and still achieves high values of dielectric constant.

A second embodiment of the invention is shown in FIG. 2.

In this arrangement, a few molecular layers of pseudoperovskite, i.e. a perovskite like structure, or perovskite itself or a superlattice on the substrate provides a boundary layer 20. This boundary layer 20 is selected to provide a good basis for growing an unstrained gate dielectric layer 12.

In this arrangement a dopant of niobium oxide ($Nb_2O_5$) is added to the gate dielectric during growth. This dopant does not form a solid solution completely with the barium titanate of the gate dielectric. If ferroelectric domains start to form, the dopants become segregated at the domain boundary and prevent further domain growth. Thus, the domains remain too small for the barium titanate to display ferroelectric properties. $Nb_2O_5$ or other dopant can make a partially solid solution with perovskite. In other words, a small amount of dopants will be incorporated in the perovskite, but most of them will exist in domain boundary.

The growth in the second embodiment again uses low temperature molecular beam epitaxy.

Alternative growth possibilities exist. Instead of using molecular beam epitaxy, pulsed laser deposition or atomic layer deposition are also suitable.

It may also be possible to use chemical vapour deposition (CVD) such as MOCVD, or a solgel process. Such processes generally operate at temperatures that would cause ferroelectric domains to grow. However, by including dopants as in the second embodiment it may also be possible to achieve a superparaelectric thin film using these processes also.

The dopant can be any oxide that does not form a solid solution with the gate dielectric and that prevents domain formation and growth. The dopant may accordingly be an oxide of Si, Ca, Al, Nb, La, Zr, Pb, Sr, Mn, W, or rare earth or a combination of these oxides. When growing the dielectric by MBE, the metal of the dopant may be added to the source of the molecular beam thereby achieving growth of a mixture of dopant and the material being doped.

In a third embodiment, the transistor is not a lateral field effect transistor but a vertical field effect transistor as shown In FIG. 3. Like components are given the same reference numerals. It will be seen that in this device the gate electrode 12 and gate dielectric 10 are formed in a trench 22. A p-type epilayer 24 forms the body, a source diffusion 6 in the epilayer forms the source, and the epilayer 4 is doped n-type and acts as the drain. The drain contact 16 is in this example a back contact.

In this embodiment, the gate dielectric 10 is formed in the trench 22 by MOCVD with a dopant to prevent domain formation.

The invention is not limited to these embodiments, but may be applied to any structure requiring a high dielectric constant thin film material.

The gate dielectric need not be barium titanate, but any thin film not necessarily perovskite that is normally ferroelectric in bulk and that becomes superparaelectric using the size effect in thin films without large domains.

In any of the embodiments, the doping and type of the n-type and p-type regions may be varied if required, for example to form n-type, p-type transistors or to form enhancement or depletion type transistors as required.

In practical devices, the skilled person will realise that a number of transistors may be formed on a single circuit to provide an integrated circuit.

The invention claimed is:

1. A semiconductor device, comprising:
   a channel region of a semiconductor;
   a conductive gate electrode adjacent to the channel region; and
   a gate dielectric between the conductive gate electrode and the channel region, the gate dielectric being a superparaelectric gate dielectric, formed of a material that is a ferroelectric in bulk, and the gate dielectric including a dopant for hindering domain growth, the dopant not forming a solid solution in the gate dielectric material.

2. A semiconductor device according to claim 1 wherein the dopant is an oxide of Nb, La, Zr, Pb, Sr, Mn, W or a rare earth element.

3. A method of making a semiconductor device, comprising:
   forming a channel region of a semiconductor;
   depositing a gate dielectric;
   depositing a gate conductor sandwiching the gate dielectric between the channel region and the gate conductor;
   forming a dopant in the gate dielectric to hinder domain growth; and wherein in the step of depositing the gate dielectric the gate dielectric is formed as a superparaelectric gate dielectric of a material that is a ferroelectric in bulk.

4. A method according to claim 3 wherein the dopant is an oxide not forming a solid solution with the material of the gate dielectric.

5. A method according to claim 4 wherein the dopant is an oxide of Si, Ca, Al, Nb, La, Zr, Pb, Sr, Mn, W or a rare earth element, or combinations of these oxides.

6. A method of making a semiconductor device, the method comprising:

depositing a superparaelectric gate dielectric material using a material that is a ferroelectric in bulk, while limiting the temperature of the gate dielectric material to less than 300° C. to mitigate the formation of ferroelectric domains in the gate dielectric material;

doping the gate dielectric material with an oxide dopant that does not form a solid solution with the material of the gate dielectric, to mitigate the formation of ferroelectric domains in the gate dielectric material; and depositing a gate conductor sandwiching the gate dielectric between the channel region and the gate conductor.

* * * * *